United States Patent
Hamada et al.

(10) Patent No.: US 10,066,313 B2
(45) Date of Patent: Sep. 4, 2018

(54) METHOD OF PRODUCING SINGLE CRYSTAL

(75) Inventors: Ken Hamada, Tokyo (JP); Hiroaki Taguchi, Tokyo (JP); Kazuyuki Egashira, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 1090 days.

(21) Appl. No.: 12/458,410

(22) Filed: Jul. 10, 2009

(65) Prior Publication Data
US 2010/0018454 A1    Jan. 28, 2010

(30) Foreign Application Priority Data

Jul. 11, 2008 (JP) .................................. 2008-181649

(51) Int. Cl.
C30B 15/20 (2006.01)
C30B 15/14 (2006.01)
C30B 29/06 (2006.01)
C30B 35/00 (2006.01)

(52) U.S. Cl.
CPC .............. *C30B 15/14* (2013.01); *C30B 15/20* (2013.01); *C30B 15/203* (2013.01); *C30B 29/06* (2013.01); *C30B 35/00* (2013.01)

(58) Field of Classification Search
CPC .......... C30B 15/20; C30B 15/14; C30B 35/00
USPC ........................................ 117/11, 13, 14, 15
See application file for complete search history.

(56) References Cited

U.S. PATENT DOCUMENTS

| | | | | |
|---|---|---|---|---|
| 6,458,203 | B1 * | 10/2002 | Hanamoto et al. | 117/14 |
| 2003/0047131 | A1 * | 3/2003 | Morita et al. | 117/13 |
| 2006/0016387 | A1 * | 1/2006 | Yokoyama et al. | 117/84 |
| 2006/0130740 | A1 * | 6/2006 | Sakurada | 117/20 |
| 2008/0184928 | A1 * | 8/2008 | Hoshi | C30B 15/14 |
| | | | | 117/13 |

FOREIGN PATENT DOCUMENTS

JP    2005-15290    1/2005

* cited by examiner

*Primary Examiner* — Matthew Song
(74) *Attorney, Agent, or Firm* — Clark & Brody

(57) ABSTRACT

After melting raw materials, a distance between a raw material melt surface and a heat-shielding member disposed so as to face to the melt surface is adjusted based on temporal changes in chamber inside conditions, such as the heater temperature at the time of completion of the seed crystal equilibration operation carried out after completion of the raw material melting procedure and/or lag time required for completion of the seed crystal equilibration operation following completion of the raw material melting procedure. As a result, single crystals can be produced efficiently and in high yield, and further, by controlling the crystal interior temperature gradient by modifying the distance between the melt surface and the heat-shielding member, it becomes possible to control the ratio V/G (V:pulling speed, G:crystal interior temperature gradient) to thereby produce single crystals free of crystal defects such as COPs and/or dislocation clusters.

8 Claims, 6 Drawing Sheets

METHOD OF PRODUCING SINGLE CRYSTAL

BACKGROUND OF THE INVENTION

1. Field of the Invention

The present invention relates to a method of producing single crystals by the Czochralski method (hereinafter referred to as "CZ method") and, more particularly, to a method of producing silicon single crystals which serve as raw materials for silicon wafers to be used as substrates for semiconductor devices.

2. Description of the Related Art

The CZ method may be mentioned as a typical one among others known for the production of silicon single crystals. In the production of a silicon single crystal by the CZ method, a seed crystal is immersed into a silicon melt in the vicinity of the surface thereof in a quartz crucible and, while the crucible and the seed crystal are rotated, the seed crystal is then slowly pulled up to thereby allow a silicon single crystal to grow adhering to the seed crystal.

It is known that, in such silicon single crystal pulling by the CZ method, the defect distribution etc. in crystal sections are greatly influenced by the rate of crystal growth on the occasion of growing single crystals, namely by the pulling speed and the crystal interior temperature gradient in the direction of the pulling axis just after solidification; and it is considered that dislocation-free single crystals having only a small number of defects can be produced by controlling the value of V/G (wherein V is the pulling speed and G is the crystal interior temperature gradient) at a specific constant level. Since it is generally difficult to control the crystal interior temperature gradient G in the direction of the pulling axis, it is a general practice to control the pulling speed V.

FIG. 1 illustrates the state of distribution of typical defects (called "grown-in" defects) occurring in a silicon single crystal obtained by the CZ method. This figure schematically shows an observation result by X ray topography for elucidating the distribution of micro-defects, whereas a wafer consisting a plane perpendicular to the pulling axis is cut out from a single crystal just after growing, immersed in an aqueous solution of copper nitrate for deposition of Cu and then subjected to heat treatment. Grown-in defects are micro-defects the cause of which is incorporated in the step of single crystal growing, being discernible in a device manufacturing process, and greatly influential on the performance of the device.

FIG. 2 is a view illustrating a general relationship between the pulling speed in the step of single crystal pulling and the site of occurrence of crystal defects and schematically shows the state of distribution of defects in a longitudinal section of a single crystal grown with the pulling speed being gradually reduced. For example, the distribution of defects as shown in FIG. 2 can be obtained by growing a single crystal while gradually reducing the pulling speed, cutting the crystal along the pulling axis in the central part of the crystal and examining the distribution of defects in the thus-obtained section by the same technique as mentioned above referring to FIG. 1.

The wafer shown in FIG. 1 is the one cut out from a single crystal at the level indicated by A in FIG. 2, or from a single crystal grown at a pulling speed corresponding to the level of A.

In the wafer shown in FIG. 1, there are found oxygen-induced stacking faults (hereinafter referred to as "OSFs") distributed in a ring-like manner at a position of about two thirds (⅔) of the outside diameter. Inside the ring-like OSFs, there are found crystal-originated particles (hereinafter referred to as "COPs") and, outside the ring of OSFs, there exists a region in which dislocation cluster defects occur. COPs are defects resulting from aggregation of vacancies introduced into crystal lattices in the vicinity of the solid-liquid interface in the step of single crystal growing; similarly, dislocation cluster defects are ones resulting from aggregation of excess silicon atoms (interstitial silicon atoms) incorporated into crystal lattices. OSFs are interstitial-silicon-atom-induced stacking faults caused during oxidizing heat treatment.

Adjacent to and outside the region of occurrence of ring-like OSFs, there is an oxygen precipitation promotion region in which oxygen precipitation has occurred actively and, between this region and the outermost region as having dislocation cluster defects, there is an oxygen precipitation inhibition region where oxygen precipitation scarcely has occurred. Both the oxygen precipitation promotion region and the oxygen precipitation inhibition one are defect-free regions where scarcely showing such grown-in defects as COPs and dislocation clusters.

As the pulling speed is increased, the region of occurrence of ring-like OSFs shifts toward the periphery and is finally driven out of a usable region of the crystal, as shown in FIG. 1 and FIG. 2. Conversely, when the pulling speed is reduced, the region of occurrence of ring-like OSFs shifts toward the central part of the crystal and finally diminishes there.

Any kind of crystal defects mentioned above deteriorates device characteristics and/or causes defectives thereof. However, COPs do not affect adversely so much, as compared with dislocation clusters, and they are rather effective in increasing the productivity. Therefore, the single crystal growing has been conventionally performed in a manner such that the pulling speed is increased so that the region of occurrence of ring-like OSFs may be located in the peripheral portion of the crystal.

However, with the advancement of device miniaturization following the recent trends of semiconductor devices toward reduction in size and integration to higher level, COPs are now significantly causative of reduction in yield of good-quality products; therefore, it is now an important task to reduce the density thereof in occurrence. Accordingly, the single crystal growing is conventionally performed in a manner such that the structure of a hot zone in the growing apparatus is improved, for example, by surrounding the pulled-up single crystal with a heat-shielding member, to thereby enlarge the above-mentioned defect-free region so that the defect-free region may occupy the whole wafer surface.

FIG. 3 schematically shows the state of defect distribution in a section along the pulling axis for a single crystal pulled up by means of a growing apparatus having such an improved hot zone structure. Like in the case illustrated in FIG. 2, the distribution patterns of respective defects in the single crystal change as shown in FIG. 3 when the single crystal growing is carried out while varying the pulling speed. Thus, when the pulling growth is carried out using a growing apparatus improved in hot zone structure within the speed range from B to C as shown in FIG. 3, single crystals having a main body portion (i.e. product portion) which is mostly occupied by the defect-free region can be produced; accordingly, wafers with least grown-in defects can be manufactured.

As for the method of producing single crystals having such a defect distribution as shown in FIG. 3, Japanese Patent Application Publication No. 2005-15290, for instance, proposes a method of controlling the crystal interior temperature gradient C, wherein the distance between a raw material melt surface and a heat-shielding member is adjusted, the heat-shielding member being disposed facing to the raw material melt surface. According to this proposed method, the ratio V/G is controlled substantially at a constant level by varying the distance between the raw material melt surface and the heat-shielding member during the progress of single crystal growth, being independent to the pulling speed V, so as to grow single crystals having a desired defect region(s), for example those having an N region in which no defects exist. It is alleged that, according to this method, single crystals can be grown efficiently without reducing the pulling speed V, and further, variations in diameter for single crystals can also be reduced, and accordingly, the productivity and yield in single crystal production can be improved.

However, the hot zone structure (heater, insulating material, etc.) in a pulling apparatus to be used in carrying out the CZ method is made of a graphitic material, and therefore, with the lapse of time, the graphitic material undergoes conversion to silicon carbide as a result of reaction thereof with evaporative substance such as those evaporated from SiO to incur expansion phenomena, and further, the evaporated silicon oxides deposit on the surface of the material. Accordingly, the state of the hot zone structure is changed, for example the radiation factor thereof is lowered; as a result, the crystal interior temperature gradient in the direction of the pulling axis is altered. Therefore, in the case of producing crystals having a desired defect distribution, in particular defect-free crystals in which neither COPs nor dislocation clusters exist, it is necessary to properly adjust the production conditions such as the distance between the raw material melt surface and the heat-shielding member and the pulling speed in response to such changes in state.

Further, for example, in the case of interruption of the pull-up for some or other reason such as the occurrence of dislocations during the pull-up, followed by remelting (melting back) of the single crystal in the middle of growth, the evaporation of silicon oxides from the silicon melt continues over a long period when complete remelting of the grown single crystal is carried out. In this case, the change in chamber inner surface radiation factor notably occurs.

Further, in the case where the start of single crystal pull-up is delayed by remelting, for instance, the quartz crucible progressively gets softened to result its distortion into a fat-and-short shape, whereby the thickness of the quartz crucible increases and the inside diameter thereof decreases, resulting in the height change of the raw material melt, which is another problem.

Therefore, for stably producing crystals having a desired defect distribution, in particular defect-free crystals, it is necessary to adjust the production conditions prior to the start of single crystal pull-up in response to such changes in chamber inside conditions, including temporal changes within the hot zone structure.

SUMMARY OF THE INVENTION

For producing single crystals having a desired defect region(s), in particular defect-free crystals, as described above, it is necessary to adjust the ratio V (pulling speed)/G (crystal interior temperature gradient) at a predetermined constant level using a single crystal growing apparatus improved in hot zone structure, for example by surrounding the pulled-up single crystal with a heat-shielding member, so that a single crystal in a state of defect distribution as shown in FIG. 3 may be obtained. To this end, the pulling speed V, which is readily controllable, is generally controlled, while the single crystal production method described in the above-cited Japanese Patent Application Publication No. 2005-15290 consists in controlling the value of V/G substantially at a desired constant level by varying the distance between the raw material melt surface and the heat-shielding member in response to the extent of growth of single crystal during single crystal growing.

However, it is very difficult to maintain the temperature gradient always at a predetermined value by precisely controlling both the distance between the raw material melt surface and the heat-shielding member and the pulling speed in response to the extent of growth of single crystal during single crystal growing. There also arises a problem; when the distance between the raw material melt surface and the heat-shielding member during single crystal growing is varied, the rate of flow of the inert gas passing through the space defined by this distance also varies, with the result that the oxygen concentration in the grown single crystal changes along a lengthwise direction of pull-up.

On the occasion of actual operation, the crystal interior temperature gradient changes depending on the temporal changes in the hot zone structure including the heater and the insulating material and on the changes in radiation factor for the chamber inner surface. In particular, in the case of interruption of pull-up and remelting of the single crystal in the middle of growth, for instance, the changes in crystal interior temperature gradient become large. Further, in some cases, the melt surface height changes due to reduction in crucible inside diameter resulting from increase in crucible thickness caused by the softening of the quartz crucible.

It is necessary to appropriately adjust the production conditions (e.g. distance between the raw material melt surface and the heat-shielding member, pulling speed) in response to such changes in the inside state of the chamber. In particular, it is necessary to adjust the production conditions prior to single crystal growth, which are significantly influenced by the above-mentioned changes in the inside state of the chamber, so that single crystals having a desired defect region(s) (in particular, defect-free crystals) may be produced efficiently and in high yield.

An object of the present invention is to provide a method of producing single crystals by the CZ method using a single crystal growing apparatus improved in hot zone structure by disposing a heat-shielding member so as to face to the raw material melt surface in a crucible, which method comprises carrying out single crystal growing after setting the production conditions (specifically, distance between the raw material melt surface and the heat-shielding member) taking into consideration the changes in the inside of the chamber, such as the temporal changes in hot zone structure and the changes in chamber inner surface radiation factor.

As a result of investigations made by the present inventors to accomplish the above object, it was found that when the temperature of the heater for raw material heating, which is installed in the hot zone, and also a required time period for completion of the seed crystal equilibration operation following completion of raw material melting (such time hereinafter also referred to as "lag time") are used as indicators, the distance between the raw material melt surface and the heat-shielding member can be set prior to starting the single crystal growing and the crystal interior temperature gradient can be properly controlled just after the start of pull-up in response to the changes in the inside state of chamber.

The gist of the present invention consists in the following single crystal production method. That is, the single crystal production method is characterized in that, in producing a single crystal from a raw material melt prepared by melting raw materials in a chamber according to the CZ method, the distance between the raw material melt surface and the heat-shielding member disposed facing to the melt surface (such distance hereinafter also referred to as "distance between the raw material melt surface and the heat-shielding member") is varied based on the temporal changes in chamber inside conditions prior to growing the above-mentioned single crystal.

The term "chamber inside conditions" so referred to herein includes factors (conditions) causing changes in the inside state of chamber, such as temporal changes in hot zone structure, for example in the above-mentioned heater and/or insulating material, changes in chamber inner surface radiation factor and, further, changes in melt surface level as being caused by the softening of the quartz crucible. As the chamber inside conditions, there may be mentioned, for example, the temperature of the heater for raw material heating, and the lag time from completion of the raw material melting procedure to completion of the seed crystal equilibration operation.

The term "distance between the raw material melt surface and the heat-shielding member" means the distance Dm from the raw material melt surface to the heat-shielding member disposed facing to that melt surface (cf. FIG. 4 to be referred to later herein).

When the temperature of the heater disposed in the chamber is adopted as the chamber inside conditions in carrying out the single crystal production method according to the present invention, it is possible to employ an embodiment (hereinafter also referred to as "Embodiment 1") in which the distance between the above-mentioned raw material melt surface and the above-mentioned heat-shielding member is varied according to the heater temperature at the time of completion of the seed crystal equilibration operation that is carried out prior to transition to the single crystal growing step following raw material melting.

The "seed crystal equilibration operation" so referred to herein is the procedure for stabilizing the melt temperature at an optimal temperature for bringing a seed crystal into contact with the surface of the raw material melt. Since the melt temperature just after raw material melting shows great local fluctuations, the fluctuations in temperature for the melt as a whole are significantly large and the system is in an unstable state, so that the above-mentioned procedure becomes necessary. The "optimal temperature" is estimated by observing the shape of the contact interface on the occasion of bringing the seed crystal into contact with the surface of the raw material melt and monitoring the crystal stretch in a radial direction. Based on this estimation, the melt temperature is controlled so as to be stabilized at the "optimal temperature", for example, by controlling the heater power (electric power) and thereby adjusting the heat input to the raw material melt.

When the lag time required from completion of raw material melting to completion of the seed crystal equilibration operation is adopted as the chamber inside conditions in the single crystal production method according to the above-defined invention (inclusive of Embodiment 1), it is also possible to employ an embodiment (hereinafter also referred to as "Embodiment 2") in which the distance between the raw material melt surface and the heat-shielding member is varied according to the lag time.

The term "lag time" so referred to herein is a required time period for completion of the seed crystal equilibration operation after completion of raw material melting, as mentioned above and, when the pull-up is interrupted for some or other reason and remelting is obliged, a required time period for the remelting is also included therein. Thus, in the latter case, the lag time corresponds to a required time period for remelting, after completion of raw material melting, plus for completion of a second seed crystal equilibration operation performed again.

The single crystal production method according to the present invention (including Embodiments 1 and 2) can enable a grown single crystal to be the one consisting of a defect-free region where neither COPs nor dislocation clusters exist.

According to the single crystal production method of the present invention, at least one of the production conditions (here, the distance between the raw material melt surface and the heat-shielding member) can be properly set prior to the start of single crystal growing in single crystal production by the CZ method in response to the temporal changes in hot zone structure, the changes in chamber inner surface radiation factor and other changes in chamber inside state, and thus, single crystals having a desired defect region can be produced efficiently and in high yield as a result of proper controlling of the crystal inside temperature gradient immediately following the start of the pull-up.

Further, since the crystal interior temperature gradient can be controlled by varying the distance between the raw material melt surface and the heat-shielding member, single crystals consisting of a defect-free region where neither COPs nor dislocation clusters exist can be produced by controlling the ratio V (pulling speed)/G (crystal interior temperature gradient).

DETAILED DESCRIPTION OF THE PREFERRED EMBODIMENTS

The single crystal production method of the present invention is, as mentioned above, a single crystal production method in which raw materials are melted in a chamber and a single crystal is produced by the CZ method from the resulting raw material melt, being characterized in that a distance between a raw material melt surface and a heat-shielding member is varied prior to growing the single crystal based on the temporal changes in chamber inside conditions.

Figure 4:
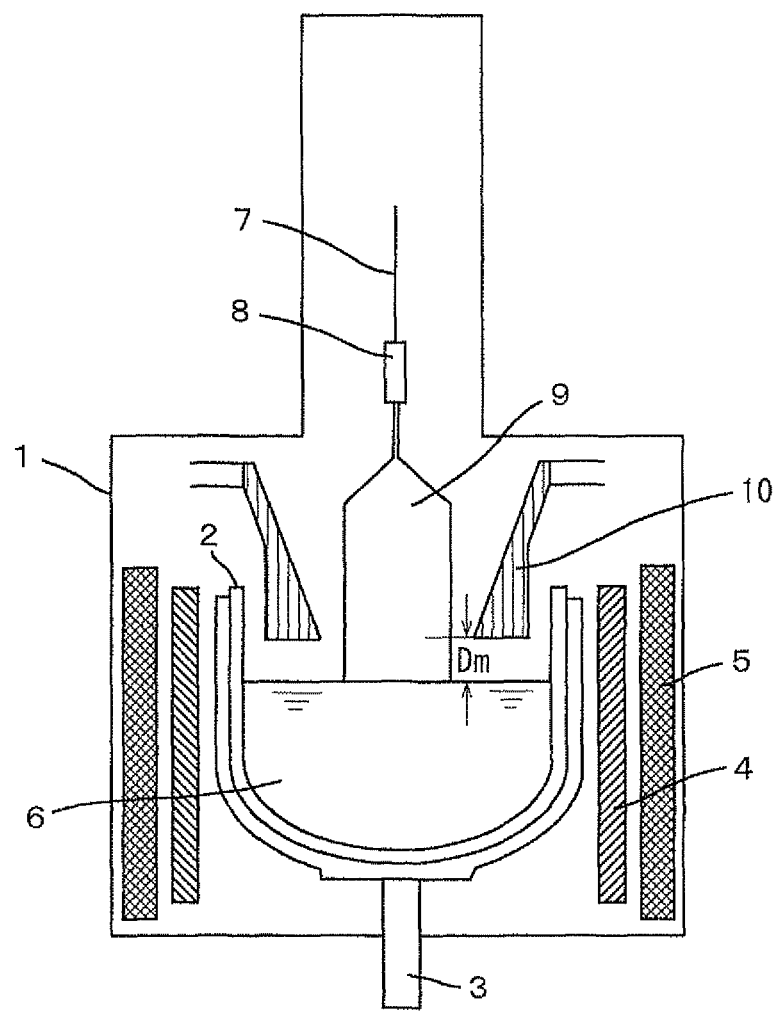
FIG. 4 is a view schematically showing an example of a configuration of principal parts of a single crystal growing apparatus suited for carrying out the production method of the present invention.

FIG. 4 is a view schematically showing an example of a configuration of principal parts of a single crystal growing apparatus suited for carrying out the production method of the present invention. The enclosure of the growing apparatus is comprised of a chamber 1 and, in the central part thereof, there is disposed a crucible 2. The crucible 2 is fixed on the top of a supporting shaft 3 which is capable of rotating and ascending/descending, and a heater 4 and a thermal insulator 5 are disposed in a generally concentric manner outside the crucible 2. A silicon material fed into the crucible 2 is melted and a raw material melt 6 is thereby formed. On the central axis of the crucible 2, there is disposed a pulling axle 7 rotatable at a predetermined speed in the reverse direction or in the same direction relative to that of the supporting shaft 3 on the same axis, and a seed crystal 8 is held at the lower end of the pulling axle 7.

This growing apparatus further comprises a heat-shielding member 10 so as to surround a pulled-up single crystal 9. This heat-shielding member 10 is made of graphite; the inner surface thereof is configured to form a reversed truncated cone-like shape and the lower end face thereof is disposed facing to the surface of the raw material melt 6.

Figure 1:
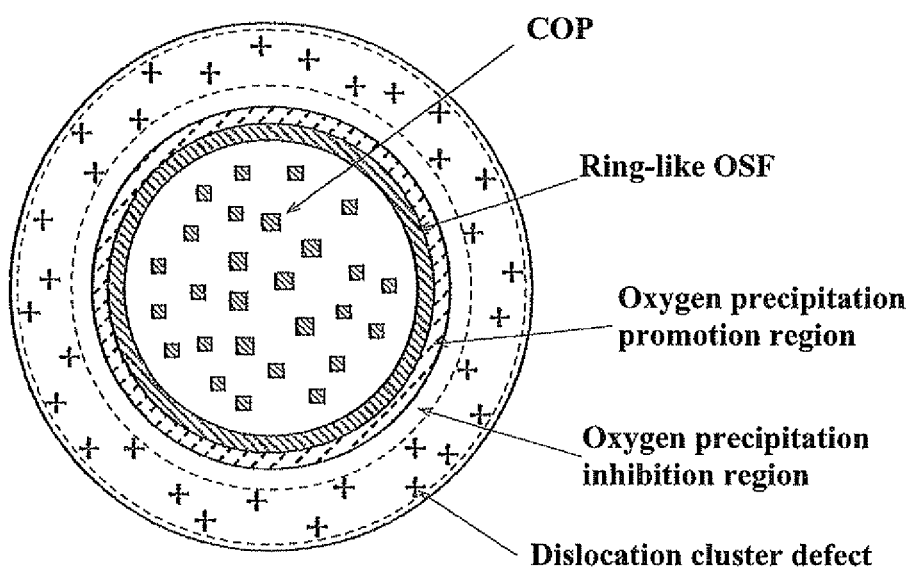
FIG. 1 is a view illustrating the distribution of grown-in defects occurring in a silicon single crystal obtained by the CZ method.
Figure 2:
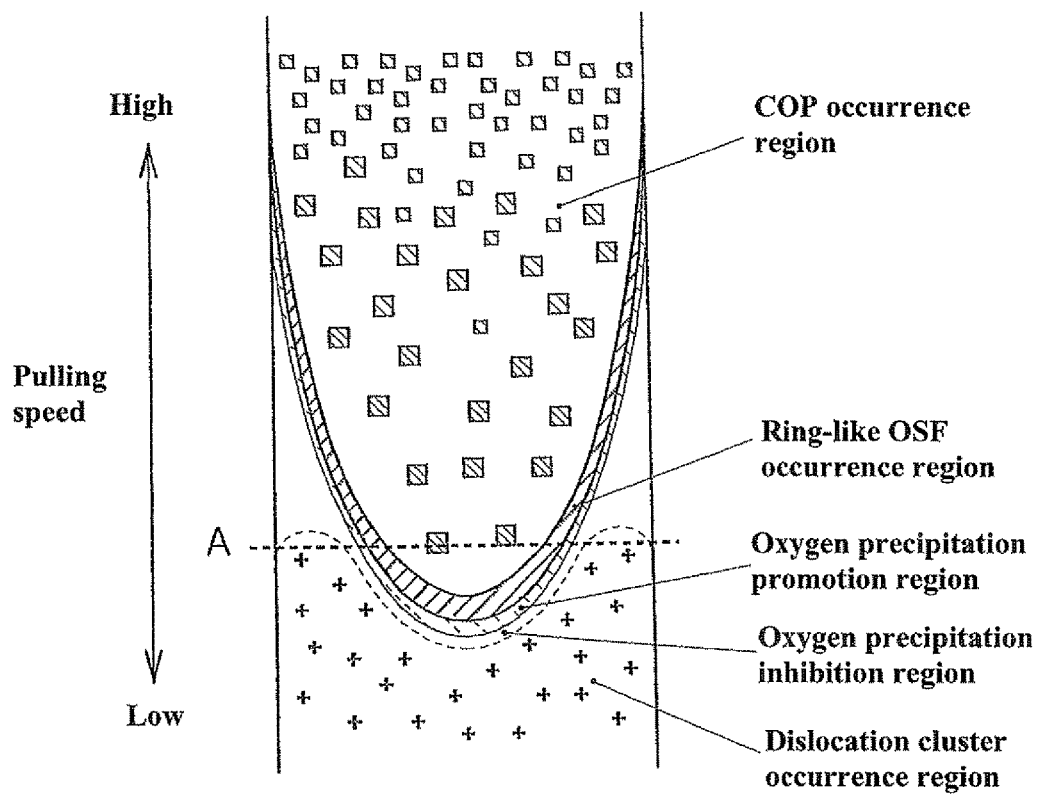
FIG. 2 is a view illustrating a general relationship between the pulling speed on the occasion of single crystal pull-up and the sites of occurrence of crystal defects and schematically shows a defect distribution state in a longitudinal section of a single crystal grown when a pulling speed is gradually changed.
Figure 3:
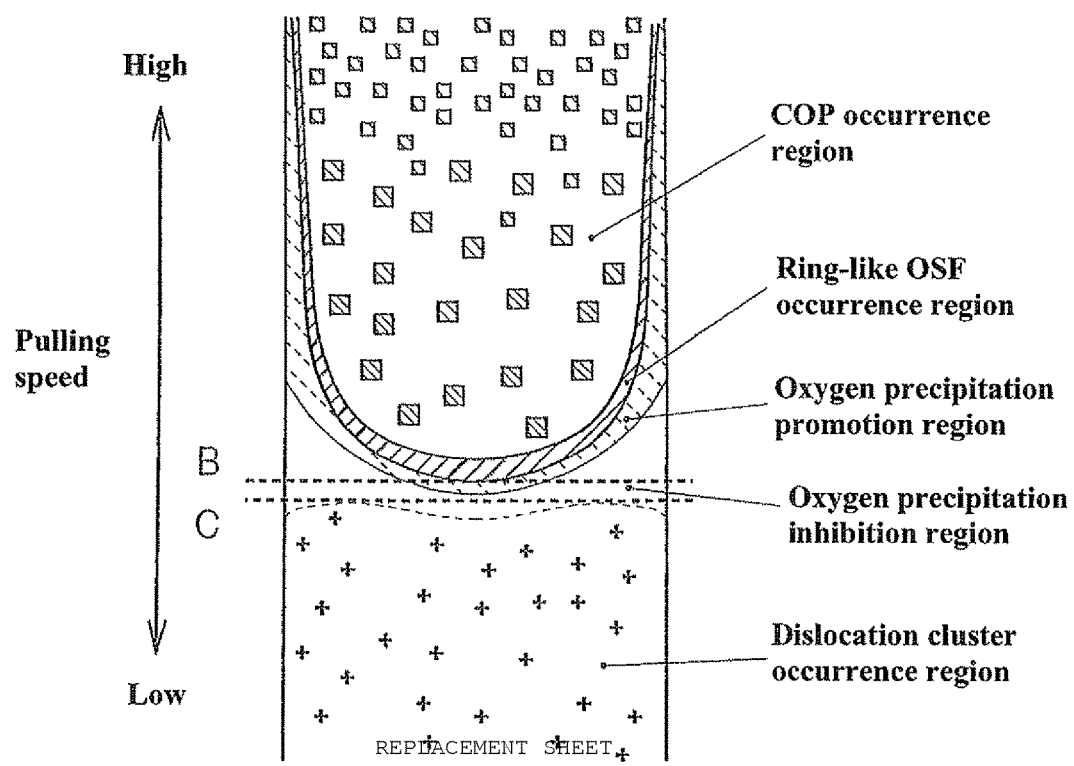
FIG. 3 is a view schematically showing a defect distribution state in a section including the pulling axis of a single crystal pulled up in a growing apparatus having an improved hot zone structure.

This apparatus is a single crystal growing apparatus improved in hot zone structure and makes it possible to control the ratio V (pulling speed)/G (crystal interior temperature gradient) and pull up a single crystal showing a defect distribution pattern shown in FIG. 3 by varying the distance Dm between the surface of the raw material melt 6 and the heat-shielding member 10 and thereby controlling the crystal interior temperature gradient. By using this growing apparatus and controlling the distance Dm between the raw material melt surface and the heat-shielding member, it becomes possible to produce single crystals consisting of a defect-free region.

According to the production method of the present invention, the distance between the raw material melt surface and the heat-shielding member is varied, prior to single crystal growing, based on the temporal changes in chamber inside conditions so that the distance between the raw material melt surface and the heat-shielding member may be properly adjusted in response to changes in the inside state of chamber.

The changes in the inside state of chamber (e.g. temporal changes in hot zone structure, changes in chamber inner surface radiation factor) are caused as a result of changes in chamber inside conditions, such as heater temperature and lag time, with the lapse of time after raw material melting, and therefore, the distance between the raw material melt surface and the heat-shielding member is varied in response to such temporal changes in chamber inside conditions. This change is made prior to single crystal growing and it is desirable that the change be made just prior to the start of growing so that the changes in the inside state of chamber may be coped with based on the latest chamber inside conditions.

The chamber inside conditions are not limited to the heater temperature and the lag time. When some other factors employable as indicators for reflecting a change in the inside state of chamber to some of the production conditions (here, the distance between the raw material melt surface and the heat-shielding member), such ones as being the distance between the raw material melt surface and the heat-shielding member may be adjusted based on that factor.

In varying the distance between the raw material melt surface and the heat-shielding member based on the temporal changes in chamber inside conditions, the operator may properly modify the distance between the raw material melt surface and the heat-shielding member based on the actual operation results, for example. It is desirable, however, to predetermine, for the concrete contents of the respective chamber inside conditions (e.g. heater temperature and lag time), the relations between the temporal changes therein (e.g. heater temperature just before starting single crystal growing, and lag time) and the distance between the raw material melt surface and the heat-shielding member, for example, by collating and analyzing actual operation data, and adjust the distance based on those relations.

The production method in Embodiment 1 mentioned above corresponds to the case in which the temperature of the heater disposed within the chamber is employed as the representative of chamber inside conditions in carrying out the single crystal production method of the present invention. In this Embodiment 1, the distance between the raw material melt surface and the heat-shielding member is adjusted in response to the heater temperature at the time of completion of the seed crystal equilibration operation, which is carried out before proceeding to the step of single crystal growing, namely in response to the heater temperature just before starting the growing operation.

More specifically, when, for example, the heater temperature at the time of completion of the seed crystal equilibration operation is higher than the defined reference temperature (heater temperature which makes it possible to adjust the melt temperature to the above-mentioned "optimal temperature" in the seed crystal equilibration operation), the heat input into the melt increases and the melt temperature deviates from the "optimal temperature", so that the distance between the raw material melt surface and the heat-shielding member is made shorter than "the distance at the defined reference temperature" (the reference distance). This action makes it possible to shield the radiant heat from the raw material melt surface and the crucible sidewall, and further, from the chamber inner surface and thereby adjust the melt temperature to the "optimal temperature".

It might be considered more appropriate to directly measure the melt temperature and adjust the same to the "optimal temperature"; however, the technique for detecting the melt surface temperature using an optical temperature-measuring means is very likely influenced by disturbing factors such as evaporation of SiO during temperature measurement, and the measured temperature likely differs from site to site to be measured due to the influence of the thermal convection of the melt. Therefore, the heater temperature is used as an indicator and the distance between the raw material melt surface and the heat-shielding member is varied in response to the heater temperature and, as a result, the crystal interior temperature gradient is adjusted.

In this case, it is desirable to determine in advance the relation between the heater temperature at the time of completion of the seed crystal equilibration operation, which is carried out prior to proceeding to single crystal growing, namely the heater temperature just before starting single crystal growing, and the distance between the raw material melt surface and the heat-shielding member and adjust the distance between the raw material melt surface and the heat-shielding member based on that relation.

As mentioned above, the heater temperature is the one that can be determined in the process of adjusting the heat input into the raw material melt by controlling the heater power (electric power) so as to stabilize the melt temperature at the "optimal temperature" in the seed crystal equilibration operation, and it can be measured accurately by using a radiation thermometer or a two-color thermometer.

The temperature at any site on the heater for heating the raw material as disposed within the chamber may be employed as the heater temperature. However, sometimes, the temperature may vary subtly from site to site on the heater; therefore, it is desirable to use the temperature at a specific site of the heater (e.g. vertical center).

The production method in the above-mentioned Embodiment 2 corresponds to the case in which the lag time required for completion of the seed crystal equilibration operation from the time of completion of raw material melting is employed as the representative of chamber inside conditions in the single crystal production method of the present invention (including the production method in Embodiment 1). In this Embodiment 2, the distance between the raw material melt surface and the heat-shielding member is modified according to that lag time.

If, for example, the seed crystal equilibration operation can be completed following raw material melting and can be followed by single crystal growing and the pull-up operation can be completed successfully without remelting to be incurred by interruption of the pull-up, the lag time is short and the changes in the inside state of chamber are relatively small. When remelting is required, the lag time becomes prolonged and the changes in the inside state of chamber, such as the temporal changes in hot zone structure and the change in chamber inner surface radiation factor, become fairly large. In such a case, the heater power (electric power) generally needs to be increased by the portion to be consumed for the resultant changes in the inside state of chamber; therefore, the distance between the raw material melt surface and the heat-shielding member is reduced to restrict the heat input into the raw material melt so that the melt temperature may be adjusted to the above-mentioned optimal temperature.

When the lag time is prolonged, the heater power changes and increases, thereby resulting in the change of the heater temperature. Therefore, when the production method in Embodiment 2 is carried out, the distance between the raw material melt surface and the heat-shielding member is to be modified in response to the lag time and the heater temperature just prior to the start of growing.

Thus, according to the production method in Embodiment 2, the distance between the raw material melt surface and the heat-shielding member is modified in response to the lag time required for completion of the seed crystal equilibration operation following the completion of raw material melting, namely in response to the lag time from the completion of raw material melting to the time just before the substantial start of single crystal growing, or, additionally, in response to the heater temperature just before the start of growing, so that large changes in the inside state of chamber can also be coped with.

Figure 5:
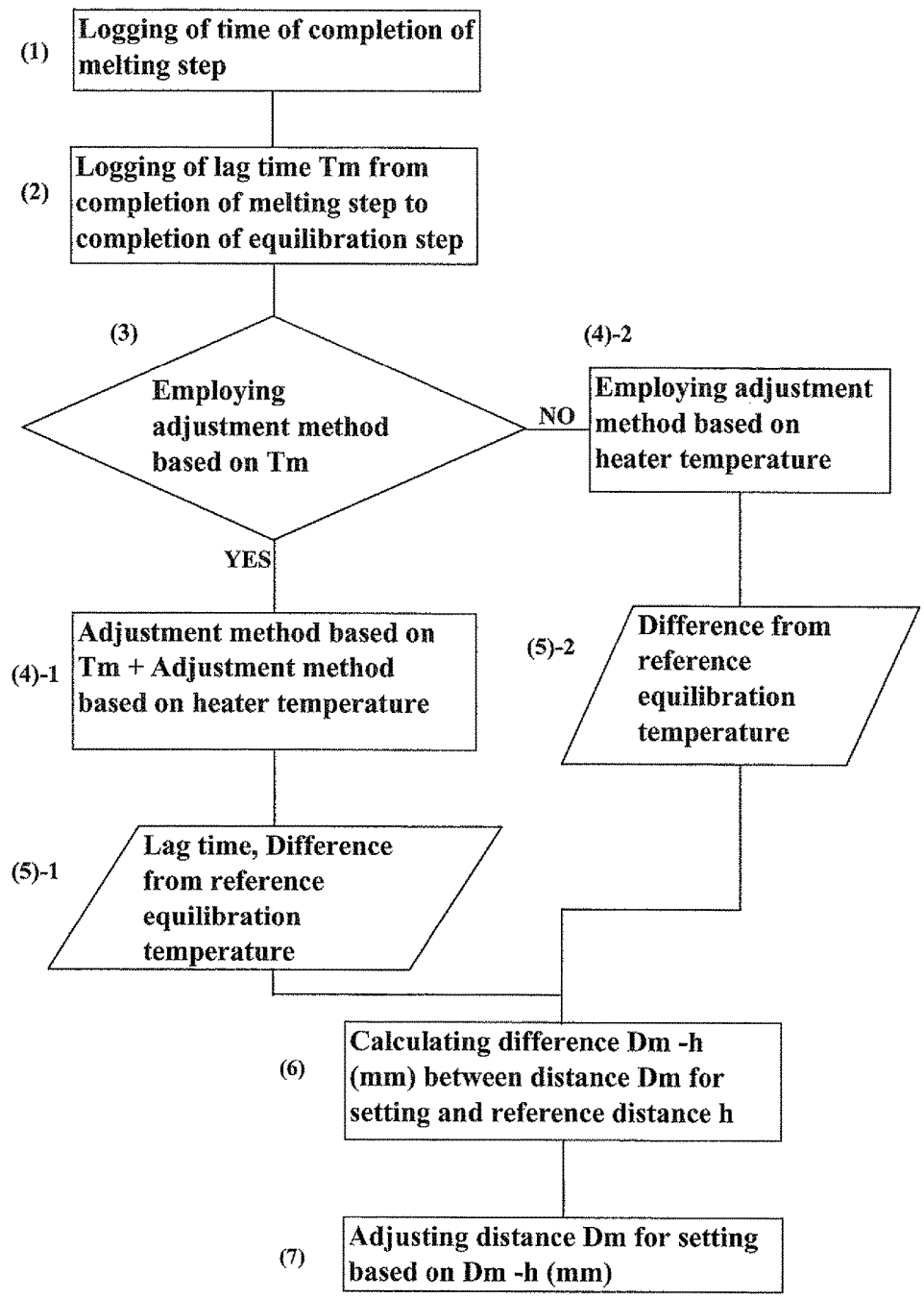
FIG. 5 is a diagram illustrating the process of setting the distance between the raw material melt surface and the heat-shielding member in carrying out the single crystal production method of the present invention (including Embodiments 1 and 2).

FIG. 5 is a diagram illustrating the process, which is to be generally employed, of setting the distance between the raw material melt surface and the heat-shielding member in carrying out the single crystal production method of the present invention (including Embodiments 1 and 2). When the method of adjustment based on the lag time Tm (method in Embodiment 2) is not employed in Step (3), as shown in that figure, the distance between the raw material melt surface and the heat-shielding member is selected based on the difference from the reference equilibration temperature according to the method of adjustment based on the heater temperature (Step (4)-2). The term "reference equilibration temperature", which is also explained in the example section given later herein, is the raw material melt temperature at the time of completion of the seed crystal equilibration operation in the case where the lag time is short. The raw material melt temperature is generally determined by measuring the heater temperature.

On the other hand, when the method of adjustment based on the lag time Tm is employed in Step (3), the distance Dm as being "the distance between the raw material melt surface and a heat-shielding member" to be set and the difference (Dm–h) from the reference distance h are determined, in Step (6), from the lag time and the difference from the reference equilibration temperature (Step (5)-1) according to the method of adjustment based on the lag time Tm and the heater temperature (Step (4)-1) and, based on the difference (Dm–h), the distance Dm between the raw material melt surface and the heat-shielding member is set (Step (7)). Incidentally, as the case where the above-mentioned method of adjustment based on the lag time Tm (method in Embodiment 2) is not employed, for example, the case of relatively short lag time could be so. The "reference distance h" is the distance between the raw material melt surface and the heat-shielding member when the raw material melt temperature is at the "reference equilibration temperature".

In accordance with the above-mentioned single crystal production method of the present invention (including Embodiments 1 and 2), it is possible to grow and produce single crystals consisting of a defect free region where neither COPs nor dislocation clusters exist, in particular silicon single crystals successfully serving as raw materials for silicon wafers which are very frequently used as substrates for semiconductor devices.

The apparatus to be used in carrying out the production method according to the present invention, including Embodiments 1 and 2, is the one improved in hot zone structure by disposing a heat-shielding member so as to face to the raw material melt surface, as illustrated in FIG. 4. By controlling the crystal interior temperature gradient through modification or adjustment of the distance between the raw material melt surface and the heat-shielding member, it becomes possible to pull single crystals having such a defect distribution as shown in FIG. 3 while controlling the ratio V (pulling speed)/G (crystal interior temperature gradient), and therefore, by grasping in advance the range of the ratio V (pulling speed)/G (crystal interior temperature gradient) in which single crystals having a defect-free region can be obtained, it becomes possible to adjust the distance between the raw material melt surface and the heat-shielding member and thereby produce single crystals consisting of a defect-free region.

EXAMPLES

Silicon single crystals having a diameter of 300 mm were grown using an apparatus with a configuration of principal parts shown in FIG. 4 and applying the single crystal production method of the present invention (including Embodiment 1 and Embodiment 2). Prior to growing, the range of the ratio V/G (V:pulling speed, G:crystal interior temperature gradient) that makes it possible to obtain single crystals having a defect-free region was grasped beforehand and the distance between the raw material melt surface and the heat-shielding member was adjusted in each case so that the ratio V/G might fall within that range.

Example 1

This is the case where the production method of the present invention was applied in Embodiment 1. As shown below in Table 1, the relation between the raw material melt temperature at the time of completion of the seed crystal equilibration operation and the distance between the raw material melt surface and the heat-shielding member was determined in advance from the data obtained by actual operations, and the distance between the raw material melt surface and the heat-shielding member was adjusted in each case based on that relation.

TABLE 1

| Raw material melt temperature [difference from reference equilibration temperature: ΔT (° C.)] | Distance Dm between raw material melt surface and heat-shielding member [difference from reference distance h: Dm − h (mm)] |
|---|---|
| 1.2 | −0.6 |
| 1.0 | −0.5 |
| 0.8 | −0.4 |
| 0.6 | −0.3 |
| 0.4 | −0.2 |
| 0.2 | −0.1 |
| 0 (Reference) | 0 (Reference) |
| −0.2 | 0.1 |
| −0.4 | 0.2 |
| −0.6 | 0.3 |
| −0.8 | 0.4 |
| −1.0 | 0.5 |
| −1.2 | 0.6 |

In Table 1, each raw material melt temperature is indicated in terms of the difference thereof from the reference equilibration temperature. When the lag time is short, the "reference equilibration temperature" is the raw material melt temperature at the time of completion of the seed crystal equilibration operation. When the lag time is short, the raw material melt temperature corresponds to the heater temperature; therefore, the reference equilibration temperature was determined by measuring the heater temperatures, which can be measured accurately.

Each distance Dm between the raw material melt surface and the heat-shielding member is indicated in terms of the difference (Dm−h) from the reference distance h. The "reference distance h" is the distance between the raw material melt surface and the heat-shielding member when the raw material melt temperature is equal to the "reference equilibration temperature".

The silicon single crystals grown by applying the production method in Embodiment 1 and adjusting the distance Dm between the raw material melt surface and the heat-shielding member in a manner mentioned above were each inspected for the presence or absence of OSFs, COPs and dislocation clusters as crystal defects by the methods shown below.

OSFs: Wafers for testing were taken from a substantially central part of each silicon single crystal grown and subjected to 16 hours of heat treatment in an oxidizing atmosphere at 1100° C., and the wafer surface was then observed under an optical microscope.

COPs and dislocation clusters: The above-mentioned wafers for inspection were etched with a mixed solution containing chromic acid and hydrofluoric acid and then the wafer surface was observed under an optical microscope.

Figure 6:
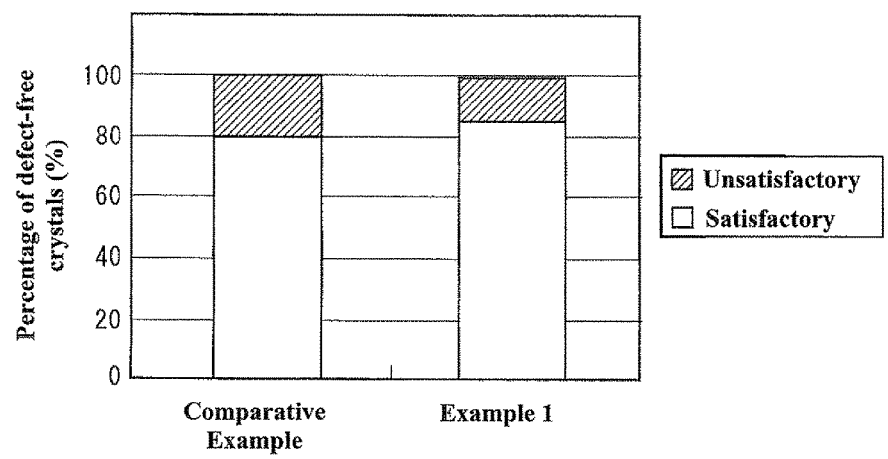
FIG. 6 is a view showing the percentage of defect-free silicon single crystals as obtainable by applying the method according to Embodiment 1 of the present invention.

The inspection results are shown in FIG. 6. In the figure, Comparative Example corresponds to a case where a silicon single crystal was grown using the same apparatus as used in Example 1 and adjusting the distance between the raw material melt surface and the heat-shielding member so that the ratio V/G might fall within the above-mentioned range grasped in advance while omitting the distance adjustment in response to the heater temperature at the time of completion of the seed crystal equilibration operation. In Example 1, 50 silicon single crystals were grown and, in Comparative Example, 20 silicon single crystals were grown; the inspection results are shown in terms of average values. "Satisfactory" means that no crystal defects were found, while "Unsatisfactory" means that OSFs and/or dislocation clusters were detected.

As shown in FIG. 6, the percentage of defect-free silicon single crystals obtained was 80% in Comparative Example whereas, when the method in Embodiment 1 was applied, the percentage was improved and arrived at 84%.

Example 2

This is the case where the production method of the present invention was applied in Embodiment 2. As shown below in Table 2, the relations between the raw material melt temperature at the time of completion of the seed crystal equilibration operation, the lag time, and the melt surface distance from the heat-shielding member were determined in advance from the data obtained by actual operations, as is the case with Example 1, and the distance between the raw material melt surface and the heat-shielding member was adjusted in each case based on those relations.

TABLE 2

| Raw material melt temperature [difference from reference equilibration temperature: ΔT (° C.)] | Distance Dm between raw material melt surface and heat-shielding member [difference from reference distance h: Dm − h (mm)] | | | | | | | | | |
|---|---|---|---|---|---|---|---|---|---|---|
| | Lag time (hr) <10 | 20 | 30 | 40 | 50 | 60 | 70 | 80 | 90 | 100 |
| 1.2 | −0.6 | −0.7 | −0.8 | −0.9 | −1.0 | −1.1 | −1.2 | −1.3 | −1.4 | −1.5 |
| 1.0 | −0.5 | −0.6 | −0.7 | −0.8 | −0.9 | −1.0 | −1.1 | −1.2 | −1.3 | −1.4 |
| 0.8 | −0.4 | −0.5 | −0.6 | −0.7 | −0.8 | −0.9 | −1.0 | −1.1 | −1.2 | −1.3 |
| 0.6 | −0.3 | −0.4 | −0.5 | −0.6 | −0.7 | −0.8 | −0.9 | −1.0 | −1.1 | −1.2 |
| 0.4 | −0.2 | −0.3 | −0.4 | −0.5 | −0.6 | −0.7 | −0.8 | −0.9 | −1.0 | −1.1 |
| 0.2 | −0.1 | −0.2 | −0.3 | −0.4 | −0.5 | −0.6 | −0.7 | −0.8 | −0.9 | −1.0 |
| 0 (Reference) | 0 (Reference) | −0.1 | −0.2 | −0.3 | −0.4 | −0.5 | −0.6 | −0.7 | −0.8 | −0.9 |
| −0.2 | 0.1 | 0 | −0.1 | −0.2 | −0.3 | −0.4 | −0.5 | −0.6 | −0.7 | −0.8 |

TABLE 2-continued

| Raw material melt temperature [difference from reference equilibration temperature: ΔT (° C.)] | Distance Dm between raw material melt surface and heat-shielding member [difference from reference distance h: Dm − h (mm)] | | | | | | | | | |
|---|---|---|---|---|---|---|---|---|---|---|
| | Lag time (hr) <10 | 20 | 30 | 40 | 50 | 60 | 70 | 80 | 90 | 100 |
| −0.4 | 0.2 | 0.1 | 0 | −0.1 | −0.2 | −0.3 | −0.4 | −0.5 | −0.6 | −0.7 |
| −0.6 | 0.3 | 0.2 | 0.1 | 0 | −0.1 | −0.2 | −0.3 | −0.4 | −0.5 | −0.6 |
| −0.8 | 0.4 | 0.3 | 0.2 | 0.1 | 0 | −0.1 | −0.2 | −0.3 | −0.4 | −0.5 |
| −1.0 | 0.5 | 0.4 | 0.3 | 0.2 | 0.1 | 0 | −0.1 | −0.2 | −0.3 | −0.4 |
| −1.2 | 0.6 | 0.5 | 0.4 | 0.3 | 0.2 | 0.1 | 0 | −0.1 | −0.2 | −0.3 |

In Table 2 as well, each raw material melt temperature is given in terms of the difference thereof from the reference equilibration temperature, as is the case with Table 1. The raw material melt temperature was determined by measuring the heater temperature. Each distance Dm between the raw material melt surface and the heat-shielding member is given in terms of the difference (Dm−h) from the reference distance h.

The silicon single crystals grown by applying the production method in Embodiment 2 and adjusting the distance of the raw material melt surface away from the heat-shielding member in a manner mentioned above were inspected for the presence or absence of OSFs, COPs and dislocation clusters as crystal defects in the same manner as in Example 1.

Figure 7:
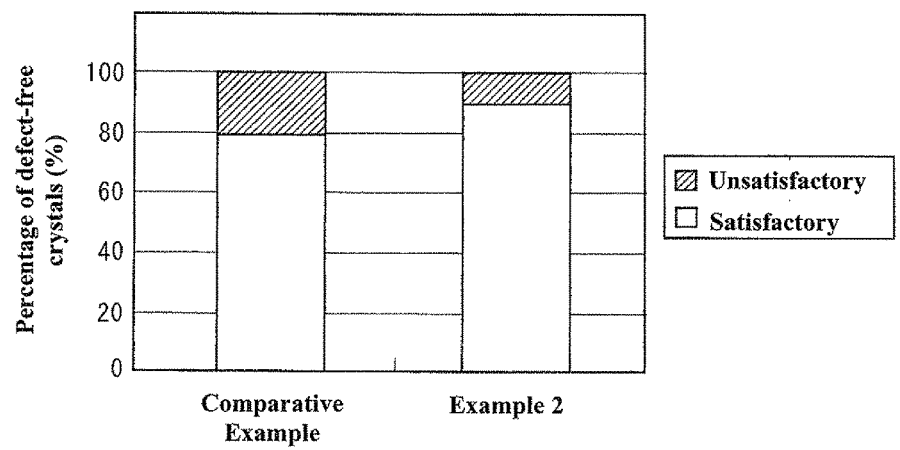
FIG. 7 is a view showing the percentage of defect-free silicon single crystals as obtainable by applying the method according to Embodiment 2 of the present invention.

The inspection results are shown in FIG. 7. In the figure, Comparative Example corresponds to a case where a silicon single crystal was grown using the same apparatus as used in Example 2 and adjusting the distance of the raw material melt surface away from the heat-shielding member so that the ratio V/G might fall within the above-mentioned range grasped in advance while omitting the distance adjustment in response to the lag time and to the heater temperature at the time of completion of the seed crystal equilibration operation. In Example 2, 50 silicon single crystals were grown and, in Comparative Example, 20 silicon single crystals were grown; the inspection results are shown in terms of average values. "Satisfactory" means that no crystal defects were found, while "Unsatisfactory" means that OSFs and/or dislocation clusters were detected.

As being evident from FIG. 7, the percentage of defect-free silicon single crystals obtained was 79.5% in Comparative Examples whereas, when the method in Embodiment 2 was applied, the percentage was improved and arrived at 90%.

As shown in FIG. 6 and FIG. 7, the percentages of single crystals having a defect-free region as grown were improved by applying the production methods of the present invention in Embodiments 1 and 2. These improvements were produced by the fact that the distance between the raw material melt surface and the heat-shielding member could be properly set in response to the changes in the inside state of chamber, such as the temporal changes in hot zone structure and the changes in chamber inner surface radiation factor, and the crystal interior temperature gradient could thus be properly controlled from just after the start of pull-up.

The single crystal production method of the present invention is a method of producing single crystals by the CZ method, in which the distance between the raw material melt surface and the heat-shielding member is varied based on such temporal changes in chamber inside conditions as the heater temperature at the time of completion of the seed crystal equilibration operation or/and the lag time required for completion of the seed crystal equilibration operation following the completion of raw material melting. According to this production method, it is possible to produce single crystals efficiently and in high yield while setting the representative of production conditions (the above-mentioned distance between the melt surface and the heat-shielding member) prior to starting the single crystal growing at a proper level.

Further, the crystal interior temperature gradient can be controlled by modifying the distance between the raw material melt surface and the heat-shielding member, so that the ratio V/G (V:pulling speed, G:crystal interior temperature gradient) can be controlled and, as a result, single crystals free of crystal defects such as COPs and/or dislocation clusters can be produced.

Therefore, the single crystal production method of the present invention can be widely utilized as an efficient production method, in particular in producing silicon single crystals.

What is claimed is:

1. A method for producing a plurality of single crystals by the Czochralski method by melting raw materials in a chamber and pulling up a plurality of single crystals from the resultant raw materials, comprising:
   i) preparing a raw material melt by melting raw materials in the chamber, the chamber including a heater and heat shielding member disposed so as to face to a raw material melt surface;
   ii) carrying out a seed crystal equilibration operation by bringing the seed crystal into contact with the raw material melt surface;
   iii) growing a single crystal by inserting the seed crystal into the raw material melt and pulling up the seed crystal;
   iv) repeating steps (i-iii) to grow a plurality of single crystals;
   the method further comprising:
   adjusting a distance between the raw material melt surface and the heat-shielding member after completion of each seed crystal equilibrium operation and just prior to a start of the growing of each single crystal, in response to a heater temperature at the time of completion of each seed crystal equilibration operation, the distance between the raw material melt surface and the heat-shielding member being adjusted based on a predetermined relation between the heater temperature and the distance, wherein the higher the heater temperature at the time of completion of the seed crystal equilibration operation is, the smaller the distance between the raw material melt surface and the heat-shielding member is set.

2. The method for producing a plurality of single crystals according to claim 1, wherein the distance between the raw material melt surface and the heat-shielding member is adjusted just prior to the start of the growing of each single crystal, in response to the heater temperature at the time of completion of each seed crystal equilibration operation and a lag time required for completion of each seed crystal equilibration operation following the completion of raw material melting.

3. The method for producing a plurality of single crystals according to claim 2, wherein the single crystal consists of a defect-free region in which neither COPs nor dislocation clusters exist.

4. The method for producing a plurality of single crystals according to claim 1, wherein the single crystal consists of a defect-free region in which neither COPs nor dislocation clusters exist.

5. The method for producing a plurality of single crystals according to claim 1, wherein a set point of the distance between the raw material melt surface and the heat-shielding member is decreased by 0.1 mm in response to an increase of the heater temperature at the time of completion of the seed crystal equilibration operation by 0.2° C.

6. A method for producing a plurality of single crystals by the Czochralski method by melting raw materials in a chamber and pulling up a plurality of single crystals from the resultant raw materials, comprising:
   i) preparing a raw material melt by melting the raw materials in the chamber, the chamber including a heater and a heat shielding member disposed so as to face to a raw material melt surface;
   ii) carrying out a seed crystal equilibration operation by bringing the seed crystal into contact with the raw material melt surface;
   iii) growing a single crystal by inserting the seed crystal into the raw material melt and pulling up the seed crystal;
   iv) repeating steps (i-iii) to grow a plurality of single crystals;
   the method further comprising:
   adjusting a distance between the raw material melt surface and the heat-shielding member after completion of each seed crystal equilibrium operation and just prior to a start of the growing of each single crystal, in response to a lag time required for completion of each seed crystal equilibration operation following completion of raw material melting, the distance between the raw material melt surface and the heat-shielding member being adjusted based on a predetermined relation between the lag time and the distance, wherein the longer the lag time is, the smaller the distance between the raw material melt surface and the heat-shielding member is set.

7. The method for producing a plurality of single crystals according to claim 6, wherein the single crystal consists of a defect-free region in which neither COPs nor dislocation clusters exist.

8. The method for producing a plurality of single crystals according to claim 6, wherein a set point of the distance between the raw material melt surface and the heat-shielding member is decreased by 0.1 mm in response to an increase of the lag time by 10 hours.

* * * * *